United States Patent [19]
Chandrakumar

[11] Patent Number: 5,719,499
[45] Date of Patent: Feb. 17, 1998

[54] DEVICE FOR EXCITATION AND DETECTION OF MAGNETIC RESONANCE USING ORTHOGONAL TRANSMITTER PROBE COILS

[75] Inventor: Narayanan Chandrakumar, Adayaru, India

[73] Assignee: Council of Scientific & Industrial Research, New Dehli, India

[21] Appl. No.: 606,488

[22] Filed: Mar. 4, 1996

[51] Int. Cl.$^6$ ............................................. G01R 33/36
[52] U.S. Cl. ............................................. 324/322
[58] Field of Search ............................. 324/300, 307, 324/316, 318, 322; 128/653.5, 653.2

[56] References Cited

U.S. PATENT DOCUMENTS

| | | | |
|---|---|---|---|
| 3,792,346 | 2/1974 | Gibby et al. | 324/322 |
| 4,345,207 | 8/1982 | Bertrand et al. | 324/308 |
| 4,418,316 | 11/1983 | Young et al. | 324/309 |
| 4,766,383 | 8/1988 | Fox et al. | 324/318 |
| 5,248,943 | 9/1993 | Fox et al. | 324/322 |
| 5,521,506 | 5/1996 | Misic et al. | 324/322 |

*Primary Examiner*—Sandra L. O'Shea
*Assistant Examiner*—Roger Phillips
*Attorney, Agent, or Firm*—Merchant, Gould, Smith, Edell, Welter & Schmidt

[57] ABSTRACT

A device for excitation and detection of magnetic resonance is presented. The device is fashioned on the principle that electromagnetic radiation is effectively described by fewer independent parameters on considering its interaction with 'spins' in a magnetic field, than would be the case in vacuum. In particular, the amplitude and phase of electromagnetic radiation are not independent of each other under such conditions. Complex pulse envelope shapes for excitation may be generated with this device either by pure amplitude modulation, or by pure phase modulation alone instead of by both amplitude and phase modulation). In the latter option, stable, efficient, low-droop Class 'C' amplifiers and standard rectangular pulse envelopes may be employed, instead of linear Class 'A' or 'AB' amplifiers and complex em pulse envelope shapes. In detection mode, signal may be picked up from either one or both of the coils. The device is applicable for NMR and ESR/EPR spectroscopy, as well as transition selective NMR/ESR/EPR spectroscopy, volume localized NMR/ESR/EPR spectroscopy and NMR/ESR/EPR including in vivo applications.

9 Claims, 2 Drawing Sheets

DEVICE FOR EXCITATION AND DETECTION OF MAGNETIC RESONANCE USING ORTHOGONAL TRANSMITTER PROBE COILS

BACKGROUND OF THE INVENTION

1. Field of the Invention

The present invention relates generally to magnetic resonance apparatus. More particularly, the present invention relates to such an apparatus for controlling the amplitude and phase of orthogonal electromagnetic fields.

2. Description of the Related Art

Coherence manipulations in modern magnetic resonance units rely heavily on complex operations on the atomic or nuclear spin system. Typically the magnetic resonance unit maintains precise control of many experimental parameters simultaneously. The experimental parameters to be controlled include the pulse frequency, phase, amplitude, shape and duration of the electromagnetic waves interacting in the resonance volume, as well as detector gating, reference wave phase and frequency, and magnetic gradient pulses ($B_0$ or $B_1$). Precise control of these parameters is required in order to achieve specific experimental objectives including coherence transfer pathway selection, artifact suppression, excitation and detection of multiple quantum coherences, uniform wideband excitation, selective excitation, encoding of spatial information and the like.

The provision of adequate control over the parameters listed above results in magnetic resonance systems which are complex, expensive and require a high level of maintenance. There is a need, therefore, for a simplified magnetic resonance system which provides the same performance as current magnetic resonance systems, but is less complex and less expensive, which will provide less wealthy institutions and developing countries greater access to the use of magnetic resonance techniques.

SUMMARY OF THE INVENTION

The present invention relates to a device for excitation and detection of magnetic resonance, including nuclear magnetic resonance (NMR), electron spin resonance (ESR) and electron paramagnetic resonance (EPR). The device employs the principle that electromagnetic (em) radiation is effectively described by fewer independent parameters on considering its interaction with 'spins' in a magnetic field, than would be the case in a vacuum. In particular, the amplitude and phase of em radiation are not independent of each other under such conditions. This principle, which is termed the duality of amplitude and phase in Zeeman fields, is implemented in the device by a tuned circuit using two identical orthogonal coils, bimodal cavities, resonators, or the like, fed by two identical sources of em radiation. Complex em pulse envelope shapes for excitation may be generated with this device either by pure amplitude modulation, or by pure phase modulation alone, unlike conventional magnetic resonance systems which require both amplitude and phase modulation. Under pure phase modulation, stable, efficient, low-droop Class 'C' amplifiers and standard rectangular em pulse envelopes may be employed, instead of linear Class 'A' or 'AB' amplifiers and complex em pulse envelope shapes as in conventional systems. In the detection mode, the signal may be picked up from either one or both of the exciting coils. The device is applicable for NMR and ESR/EPR spectroscopy, as well as transition selective NMR/ESR/EPR spectroscopy, volume localized NMR/ESR/EPR spectroscopy and NMR/ESR/EPR including in vivo applications.

The main object of the present invention is to provide a device for excitation and detection of magnetic resonance, which controls RF phase and amplitude relying on their duality in the Zeeman interaction frame.

These and various other features as well as advantages which characterize the present invention will be apparent upon reading the following detailed description and review of the associated drawings.

DETAILED DESCRIPTION OF THE EMBODIMENT

Figure 1:
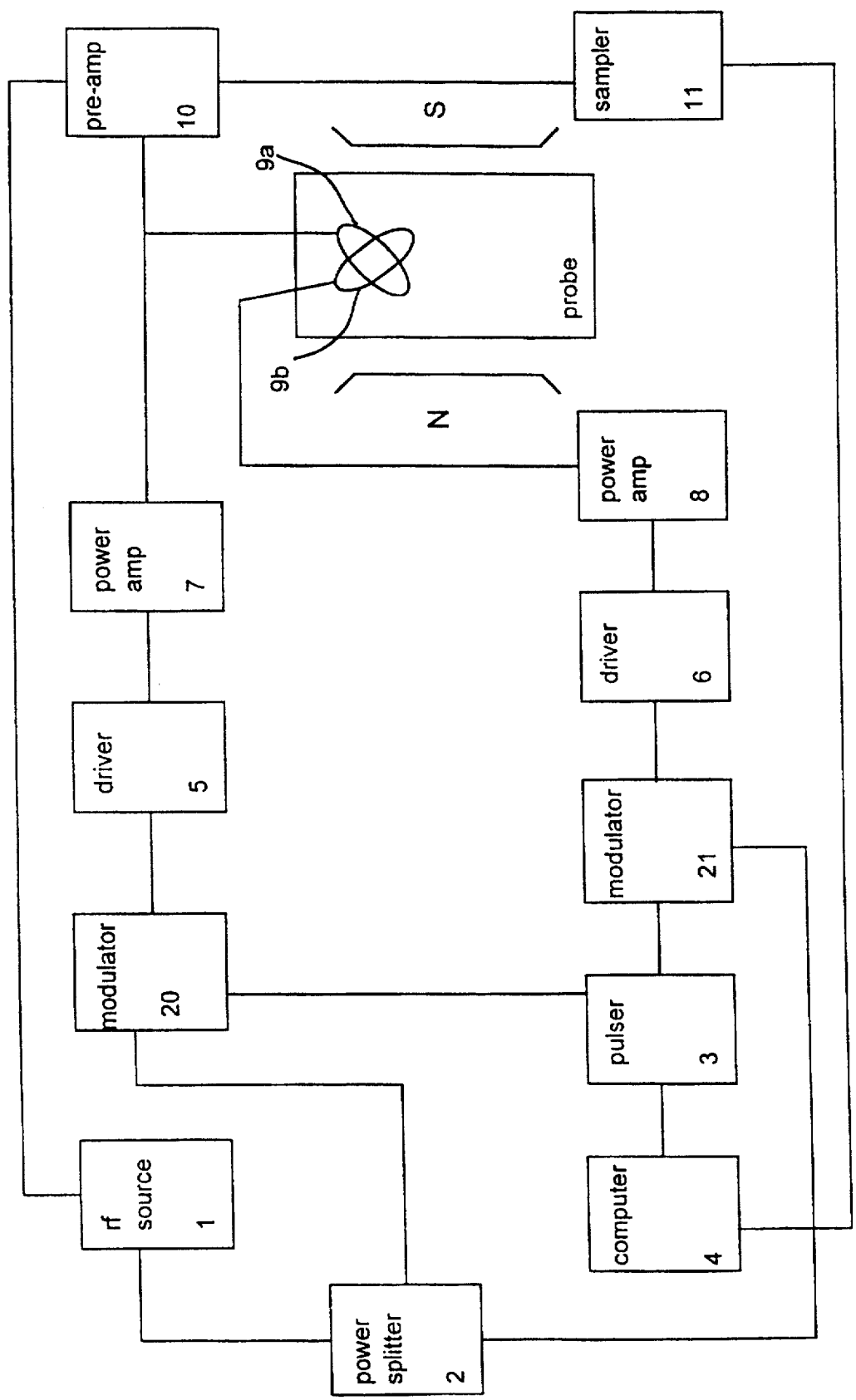
FIG. 1 shows a block diagram of a first embodiment of the invention.

In magnetic resonance (MR) procedures, such as nuclear magnetic resonance (NMR), electron spin resonance (ESR) and electron paramagnetic resonance (EPR), a linearly polarized radio-frequency/microwave (RF) field is generated in a coil/resonator surrounding a sample under examination. The coil/resonator is hereinafter generically referred to as the probe coil. The probe coil has an axis lying along the direction specified by the unit vector $\hat{e}$, and stimulates transitions in the atomic or nuclear spin systems of the sample. The effect of the stimulating RF field may be expressed in the reference laboratory coordinate frame by means of the spin Hamiltonian $H_{rf}$ as follows:

$$H_{rf} = 2\hbar\gamma B_1(\cos(\omega t + \phi))\vec{e} \cdot \vec{I} \quad [1]$$

Here $2B_1$ is the amplitude of the RF field, $\omega$ is its angular frequency, $\phi$ its phase, $\hbar$ is Planck's constant. This expression is independent of the spin quantum number and is also valid in the zero field situation. Transforming to the Zeeman interaction frame, otherwise known as the rotating frame, which is valid for NMR and EPR, we find, for arbitrary spin quantum number:

$$\tilde{H}_{rf} = \exp(i\omega I_z t) H_{rf} \exp(-i\omega I_z t) \quad [2]$$
$$= -2\hbar\gamma B_1(\cos(\omega t + \phi))\exp(i\omega I_z t)(\vec{e} \cdot \vec{I})\exp(-i\omega I_z t)$$

It follows immediately that:

$$\tilde{H}_{rf} = 2\hbar\omega_1(\cos(\omega t + \phi))[nI_z + l(I_x\cos\omega t - I_y\sin\omega t) + m(I_y\cos\omega t + I_x\sin\omega t)] \quad [3]$$

where:

$$\omega_1 = \gamma B_1; \quad [4]$$

$$\hat{e} = l\hat{i} + m\hat{j} + n\hat{k};$$

$$l^2 + m^2 + n^2 = 1;$$

$$\vec{e} \cdot \vec{I} = lI_x + mI_y + nI_z;$$

We have, after truncation of non-secular terms, the final form of the RF Hamiltonian in the rotating frame:

$$\tilde{H}_{rf} = \hbar\omega_1[I_x(l\cos\omega - m\sin\omega) + I_y(l\sin\omega + m\cos\omega)] \quad [5]$$

For $\omega=0$, therefore:

$$\tilde{H}_{rf} = \hbar\omega_1(lI_x + mI_y) \quad [6]$$

while for $l=1$, $m=0$:

$$\tilde{H}_{rf} = \hbar\omega_1(I_x\cos\phi + I_y\sin\phi) \quad [7]$$

From Eqns. [6] and [7] it follows that, viewed in the Zeeman interaction frame, the effect of reorientation or shift of the probe coil axis in the laboratory frame is entirely equivalent to RF phase shifts for n=0.

The inventor observed that the realization of this duality is in principle feasible by various experimental means, e.g., by mechanical reorientation of the probe coil axis, or by electromagnetic switching of the direction of RF polarization employing two orthogonal probe coils. In particular, the form represented by Eqn. [5]—and therefore the form represented by Eqn. [6]—may be realized in a probe with two identical probe coils lying along the laboratory frame x and y axes respectively, by feeding RF currents of equal frequency and phases, with variable amplitudes $B_{1x}$ and $B_{1y}$ such that:

$$B^2{}_{1x}+B^2{}_{1y}=\text{constant} \qquad [8]$$

Alternately stated, by varying the relative amplitudes of the RF in the two orthogonal probe coils and keeping the sum of squares of the amplitudes constant to maintain a constant pulse flip angle, the effect of an arbitrary phase shift may be achieved, even although the actual RF phase is maintained constant.

Conversely, if the probe coils of such a probe are fed RF currents of equal frequency and amplitude with variable phases $\phi_x$ and $\phi_y$, it is observed that:

$$\tilde{H}_{rf}=\hbar\omega_1[I_x(\cos\phi_x-\sin\phi_y)+I_y(\cos\phi_y+\sin\phi_x)] \qquad [9]$$

For $\phi_y=[\pi/2-\phi_x]$, i.e. $\phi_y+\phi_x=\pi/2$, it follows that:

$$\tilde{H}_{rf}=\hbar I_y 2\omega_1 \sin\phi_x=\hbar\omega_{1eff}I_y \qquad [10]$$

while for $$\phi_y=\left[\frac{3\pi}{2}-\phi_x\right],$$

i.e.

$$\phi_y+\phi_x=\frac{3\pi}{2},$$

we have:

$$\tilde{H}_{rf}=\hbar I_x 2\omega_1 \cos\phi_x=\hbar\omega_{1eff}I_x \qquad [11]$$

From Eqns. [10] and [11], it is clear that under these conditions, an arbitrary effective RF field amplitude may be generated for frequencies in the range $-2\omega_1 \leq \omega_{1eff} \leq 2\omega_1$, and keeping the effective 'phase' constant, corresponding to the operator $I_x$ or $I_y$ in the Zeeman interaction frame, without actually varying the RF amplitude.

These results with a two-orthogonal-probe coil system are most readily appreciated by explicitly writing out the RF Hamiltonian for a two-probe coil system that is fed RF with different amplitudes and phases, but with the same frequency, the axes of the two probe coils being along the laboratory frame x and y directions, respectively:

$$H_{rf}=2\hbar[\omega_{1x}(\cos(\omega t+\phi_x))I_x+\omega_{1y}(\cos(\omega t+\phi_y))I_y] \qquad [12]$$

This Hamiltonian is readily transformed into the Zeeman interaction frame, where it takes the following form:

$$\begin{aligned}\tilde{H}_{rf} &= \hbar[\omega_{1x}(I_x\cos\phi_x+I_y\sin\phi_x)+\omega_{1y}(I_y\cos\phi_y-I_x\sin\phi_y)] \\ &= \hbar[I_x(\omega_{1x}\cos\phi_x-\omega_{1y}\sin\phi_y)+I_y(\omega_{1y}\cos\phi_y+\omega_{1x}\sin\phi_x)]\end{aligned} \qquad [13]$$

It is clear that with $\phi_x=0=\phi_y$, the above equation takes the form of Equ. [6]:

$$\tilde{H}_{rf}=\hbar[\omega_{1x}I_x+\omega_{1y}I_y] \qquad [14]$$

while with $\omega_{1x}=\omega_{1y}=\omega_1$, we get the form of Equ. [9].

The duality of phase and amplitude in the Zeeman interaction frame thus offers interesting possibilities to reduce the number of independent variables that characterize a magnetic resonance excitation pulse produced by the hitherto known devices, as is explained hereinabove. The inventor has shown that by the appropriate modifications of the hardware requirements and limitations for specific applications, one could envisage that an independent phase shifting capability could be done away with, in the presence of a variable amplitude capability, employing, for example, a linear RF amplifier. One could also envisage that an independent variable amplitude capability could be done away with, in the presence of a fine increment phase shifting capability, employing, for instance, a digital phase shifter.

The device of the present invention employs a probe head with two orthogonal probe coils, both probe coils to be fed RF of identical frequency, but with either: (a) the same amplitude but different phases (first technique), or (b) with the same phase but different amplitudes (second technique). Bimodal microwave cavities may also be constructed at higher frequencies.

The probe head/cavity built on the device will be driven by a magnetic resonance console, with a special modulation pattern developed for this application.

Employing the first technique results in the possibility of generating real or complex RF pulse envelope modulation without the requirement of using waveform memories/modulators nor linear Class 'A' or Class 'AB' RF amplifiers. The first technique requires only phase shifters. The phase shifters may be either digital or analog.

Employing the second technique results in the possibility of generating imaginary or complex RF pulse envelope modulation without the requirement of either analog or digital phase shifters, but employing instead a suitable amplitude modulation and linear RF amplification capability.

Complex RF pulse envelope modulation is a highly prized capability on modern NMR/pulsed EPR spectrometer systems, in order to efficiently perform a variety of tasks related to selective excitation in MR imaging and spectroscopy. An application of the duality of phases and amplitudes in the Zeeman interaction frame is to convert a complex RF pulse envelope modulation into either pure amplitude modulation or pure phase modulation. The latter possibility seems particularly attractive, since it does away with the requirement of special waveform memories/modulators and Class 'A' or 'AB' linear RF amplifiers, enabling operation instead with standard analog or digital phase shifters and standard Class 'C' RF amplifiers. It is to be emphasized that the device employing the above said principle is not known in the art. This principle has not been recognized and taken advantage of in the currently available NMR and EPR spectrometer/imaging systems, which normally provide separately for both amplitude and/or phase modulation, working normally with probes/resonators that do not have the required special construction.

Further, it is interesting to note that the duality between phase and amplitude demonstrated in the foregoing is valid only in the Zeeman interaction frame. In the twin area of 'pure' nuclear quadrupole resonance (NQR), amplitude and phase constitute independent parameters in the quadrupole interaction frame, as may be verified in a straightforward fashion for spin-1 nuclei, for example. Given the same form of the laboratory frame RF Hamiltonian as in Eqn. [1], we find in the quadrupole interaction frame:

$$\tilde{H}_{rf} = -2\hbar\gamma B_1(\cos(\omega t + \phi))\exp(i\omega I_z^2 t)(\hat{e} \cdot \vec{I})\exp(-i\omega I_z^2 t) = \quad [15]$$

$$2\hbar\omega_1(\cos(\omega t + \phi))\ [nI_z + l(I_x\cos\omega t - [I_y, I_z]_+\sin\omega t) +$$

$$m(I_y\cos\omega t + [I_x, I_z]_+\sin\omega t)]$$

Here:

$$[I_i, I_j]_+ = I_iI_j + I_jI_i \quad [16]$$

This leads, after truncation of non-secular terms, to:

$$\tilde{H}_{rf} = \hbar\omega_1\{l(I_x\cos\phi + [I_y, I_z]_+\sin\phi) + m(I_y\cos\phi - [I_x, I_z]_+\sin\phi)\} \quad [17]$$

For $\phi=0$, therefore, we have:

$$\tilde{H}_{rf} = \hbar\omega_1(lI_x + mI_y) \quad [18]$$

while for l=1, m=0, we find:

$$\tilde{H}_{rf} = \hbar\omega_1(I_x\cos\phi + [I_y, I_z]_+\sin\phi) \quad [19]$$

demonstrating the inequivalence of probe coil reorientation and phase shift in the quadrupole interaction frame, even when n=0. This inequivalence leads to the possibility of novel NQR experiments, and novel NQR excitation/detection schemes.

A first embodiment of the device of the present invention, for the excitation and detection of magnetic resonance of a sample, is shown in FIG. 1. The first embodiment includes a first RF source 1, such as an oscillator or frequency synthesizer, operating at a frequency corresponding to the Larmor resonance frequency of the nuclear or electron system of the sample whose magnetic resonance has to be excited and detected. The output of the first RF source 1 is directed to a power splitter 2 having two outputs, a first output being connected to a first modulator 20, and a second output being connected to a second modulator 21, which is similar to the first modulator 20. The modulators 20 and 21 are described further hereinbelow. A pulser 3, which is controlled by a computer 4, has two outputs connected to the two modulators 20 and 21, respectively. The output signals from the modulators 20 and 21 preferably lie in the range of 1 Volt peak-to-peak, and are directed to the inputs of identical drivers 5 and 6, or pre-amplifiers, respectively. The output signals from the drivers 5 and 6 have a power preferably in the range 5–20 Watts and these output signals are directed to identical power amplifiers 7 and 8, which generate output signals preferably lying in the range 25–1500W into 50 Ω.

The outputs of the power amplifiers 7 and 8 are connected to a probe 9, which contains two identical, orthogonal probe coils 9a and 9b surrounding the sample whose resonance is being excited, the coils 9a and 9b being tuned to the resonance frequency of the sample, implemented as a two coil system/bimodal resonator/cavity. The electromagnetic isolation provided between the coils 9a and 9b is preferably better than 40 dB, and more preferably in the range 50–65 dB.

The inner diameter of the probe coils 9a and 9b in the probe 9 may be of any suitable size to accept the sample under MR investigation, except, perhaps, for miniature coils of diameter less than around 0.5 mm, owing to practical size limitations with systems of two identical orthogonal coils. In particular, it is possible to build coils, based on the present invention, having a diameter corresponding to a human head or human torso, such as would be used in clinical magnetic resonance imaging (MRI) applications. In general, all coil/resonator sizes currently used for conventional NMR, ESR, and EPR work, related to spectroscopy, micro-imaging and whole-body imaging, are applicable for use with the present invention.

The output of the probe 9 is taken from one of the two probe coils as illustrated as 9a of the probe 9 and is connected to the input of a preamplifier/receiver 10 for detecting the resonance signals from the sample. A second output from the first RF source 1 is connected directly to the preamplifier/receiver 10 for synchronization. The preamplifier/receiver 10 preferably includes a front-end low noise small signal amplifier, followed by a quadrature phase sensitive detector and low pass filter. The output from the preamplifier-receiver 10 is directed to a signal sampler 11 for digitizing the signals, and the output of the signal sampler 11 is connected to the input of the computer 4. The signal sampler 11 preferably operates at an appropriate frequency to meet or exceed the Nyquist criterion.

Figure 2:
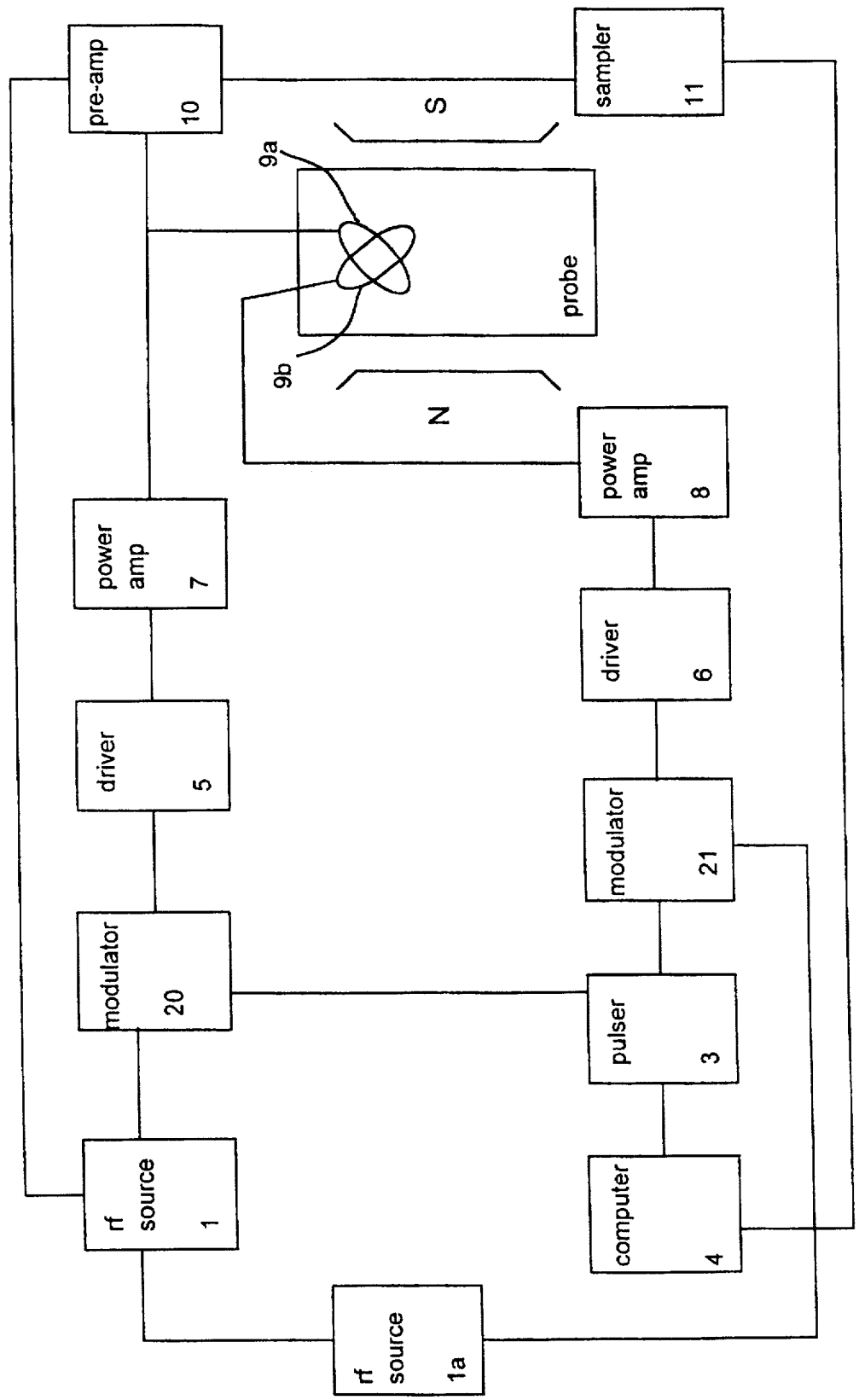
FIG. 2 shows a block diagram of a second embodiment of the invention.

In the second embodiment illustrated in FIG. 2, a slave RF source 1a, which produces an output identical to the output of the first RF source 1, is connected to a third output of the first RF source 1. In this embodiment, the output of the first RF source 1 is directly connected to the input of the first modulator 20, while the output of the slave RF source 1a is directly connected to the input of the second modulator 21.

The RF sources 1 and 1a may be highly stable RF sources, as required, and provide a continuous wave output to the modulators 20 and 21. The modulators 20 and 21, in turn, are driven by a desired excitation pattern generated by the pulser 3, which is operated under control of the computer 4 so that sophisticated gating patterns may be generated automatically. The pulser 3 is preferably a high frequency device that permits a timing resolution better than 200 ns, and more preferably has a timing resolution of 50 ns. In order to implement the first technique described hereinabove, the modulators 20 and 21 and/or RF source 1 and/or 1a may have the capability for fine angle phase shifts, preferably finer than at least 2°, generated either by analog or digital technology. Alternatively, in order to implement the second technique described hereinabove, the modulators 20 and 21 and/or RF source 1 and/or 1a may have the capability of controlling the amplitude setting. This may be achieved by computer controlled attenuation of the output from the modulators 20 and 21. The nature of the power amplifier is determined by the implementation. Thus, Class 'C' amplifiers are employed for the first technique while, for the second technique, Class 'A' or 'AB' amplifiers are employed. The outputs from the power amplifiers 7 and 8 feed respectively to the two identical orthogonal probe coils 9a and 9b of the probe 9, while one of the two coils, shown in FIG. 1 to be coil 9a is connected to the signal preamplifier/receiver 10. The filtered audio-frequency (AF) output from the receiver 10 is digitized in the signal sampler 11, which may be implemented as an analog-to-digital converter (ADC), having a minimum dwell lying preferably in the range of 2–4 μs. The data output from the sampler 11 may then be stored on the computer 4, either on the computer itself or on peripheral devices.

The two channels of the spectrometer, 20-5-7-9 and 21-6-8-9 for the first embodiment and 1-20-5-7-9 and 1a-21-

6-8-9 for the second embodiment, use identical frequencies. It is pointed out that the device of the present invention is not related to the well-known device useful for MR excitation with circularly polarized (CP) RF. In the known device, a probe head is employed with two orthogonal coils that are fed RF of identical frequency and amplitude, phase shifted by 90°. Thus we have the relationship: $\phi_y=\phi_x-\pi/2$, i.e. $\phi_x-\phi_y=\pi/2$.

This condition on the difference of the two phases is in contrast with the condition on the sum of the two phases that is to be satisfied for the present invention, Equation [9]. CP probe heads are occasionally employed for clinical whole-body MR imaging. Further, the CP excitation/detection device requires only a single quadrature phase hybrid, and therefore uses only a single RF source without a power splitter, and a single modulator to generate the two inputs for the two drivers and power amplifiers and thence the two coils of the CP probe. The present invention is thus clearly distinct from CP excitation/detection not only in its principle and function, but also in its construction.

The device of the present invention may be operated by locating and fixing the probe 9 in a magnetic field, as indicated by the magnet poles marked as N and S in the FIGS. 1 and 2; the operating frequency of the device is set in accordance with the selected nucleus or electron whose magnetic resonance is to be excited and detected, as well as by the magnetic field intensity. The sample of spin systems to be investigated is loaded into the probe 9 in a suitable sample tube. An excitation pattern is selected based on the desired mode of operation, where the relevant parameters may be frequency bandwidth of the excitation, the percentage quadrature signal components, the coherence transfer pathway and the like. The gating pattern selected may then be imposed as modulation on the cw RF to interrogate the spin system and the result may be detected in terms of the free induction or echo signals that arise. These signals are digitized and fed to the computer 4 for further processing, preferably by way of multi-dimensional Fourier transformation to generate the desired magnetic resonance spectrum, volume localized spectrum, or image of the sample.

The device of the present invention enables the simple implementation of RF phase and amplitude control within the context of magnetic resonance, which avoids the independent control of redundant parameters. By exploiting the interdependence or duality of phases and amplitudes in the Zeeman interaction frame, the need for independent control of the parameters is obviated and the possibility of stable Class 'C' operation is opened up.

It is to be understood that even although numerous characteristics and advantages of the various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the power of the RF signals at various stages of the apparatus may vary depending on which commercial components are used to implement the invention.

What is claimed is:

1. A device for excitation and detection of magnetic resonance of a sample which comprises:

A first radio frequency source operating at a frequency corresponding to a Larmor resonance frequency of a sample whose magnetic resonance is to be excited and detected, an output of the first source being connected to a power splitter having two outputs, one of the splitter outputs being connected to a first modulator, and the other splitter output being connected to a second modulator, a pulser, an input to which is connected to a computer, the pulser having two outputs being connected to the first and second modulators, respectively, respective outputs from the first and second modulators being connected to respective inputs to two drivers, respective outputs from the drivers being connected to respective inputs to two power amplifiers, respective outputs from the two power amplifiers being connected to respective identical probe coils in a probe, the probe coils being tuned to a resonance frequency of the sample, the probe coils being provided with an electromagnetic isolation between probe coils of better than 40 dB, an output of the probe from one of the probe coils being connected to an input of a preamplifier-receiver for detecting resonance signals from the sample, another output from the first source being connected to another input to the preamplifier-receiver, an output of the preamplifier-receiver being connected to an input of a signal sampler for digitizing the resonance signals, an output from the signal sampler being connected to an input to the computer.

2. An apparatus for the excitation and detection of magnetic resonance signals from a sample, comprising:

first source means for providing a first radio-frequency signal;

splitting means for splitting the first radio-frequency signal into first and second split signals;

first and second modulating means for modulating the first and second split signals respectively;

pulsing means, for pulsing the first and second modulating means;

computing means for controlling the pulsing means;

first and second driving means, for amplifying signals output from the first and second modulating means respectively;

first and second power amplifying means, for further amplifying signals output from the first and second driving means respectively;

a probe, including first and second probe coils disposed in an orthogonal relationship to each other and receiving input signals from the first and second power amplifying means respectively;

preamplifier/receiving means for receiving an output signal from one of the first and second probe coils and for receiving an output signal from the first source means; and signal sampler means for receiving a detected output signal from the preamplifier/receiving means and digitizing the detected output signal and for directing the digitized output signal to the computing means.

3. The apparatus of claim 2, wherein inner diameters of the first and second probe coils lie in the range 5 millimeters to 25 millimeters.

4. The apparatus of claim 2, wherein the first and second modulators are phase shifters.

5. The apparatus of claim 2, wherein the first and second modulators amplitude modulate the first and second split signals.

6. An apparatus for the excitation and detection of magnetic resonance signals from a sample, comprising:

first and second source means for providing first and second radio-frequency signals respectively, the first source means directing a synchronizing radio-frequency signal to the second source means;

first and second modulating means for modulating the first and second radio-frequency signals respectively;

pulsing means for pulsing the first and second modulating means;

computing means for controlling the pulsing means;

first and second driving means, for amplifying signals output from the first and second modulating means respectively;

first and second power amplifying means, for further amplifying signals output from the first and second driving means respectively;

a probe, including first and second probe coils disposed in an orthogonal relationship to each other and receiving input signals from the first and second power amplifiers respectively;

preamplifier/receiving means for receiving an output signal from one of the first and second probe coils and for receiving an output signal from the first source means; and signal sampler means for receiving a detected output signal from the preamplifier/receiving means and digitizing the detected output signal and for directing the digitized output signal to the computing means.

7. The apparatus of claim 6, wherein the first and second modulators are phase shifters.

8. The apparatus of claim 6, wherein the first and second modulators amplitude modulate the first and second radio-frequency signals respectively.

9. A device for excitation and detection of magnetic resonance of a sample, comprising:

a first radio frequency source operating at a frequency corresponding to a Larmor resonance frequency of the sample, an output of the first source being connected to a first modulator; a second radio-frequency source, connected to another output of the first source, having an output signal similar to an output signal from the first source, and having an output connected to an input of a second modulator; a pulser, an input to the pulser being connected to a computer, the pulser having two outputs being connected to the first and second modulators, respectively; respective outputs from the first and second modulators being connected to respective inputs to two drivers; respective outputs from the drivers being connected to respective inputs to two power amplifiers; respective outputs from the two power amplifiers being connected to respective identical probe coils in a probe, the probe coils being tuned to a resonance frequency of the sample, the probe coils being provided with an electromagnetic isolation between probe coils of better than 40 dB; an output of the probe from one of the probe coils being connected to an input of a preamplifier-receiver for detecting resonance signals from the sample, another output from the first source being connected to another input to the preamplifier-receiver; an output of the preamplifier-receiver being connected to an input of a signal sampler for digitizing the resonance signals; an output from the signal sampler being connected to an input to the computer.

* * * * *

UNITED STATES PATENT AND TRADEMARK OFFICE
CERTIFICATE OF CORRECTION

PATENT NO. : 5,719,499

DATED : FEBRUARY 17, 1998

INVENTOR(S): CHANDRAKUMAR

It is certified that error appears in the above-identified patent and that said Letters Patent is hereby corrected as shown below:

Title page, [57] Abstract, line 1: "A device" should read --The present invention relates to a device --

Title page, [57] Abstract, line 2: delete "is presented" after the word "resonance"

Title page, [57] Abstract, line 8: after the word "conditions." insert -- This principal, which we term the duality of amplitude and phase in Zeeman fields, is implemented in the device by means of a tuned circuit with two identical orthogonal coils (or bimodal cavities/resonators), fed by two identical electromagnetic rays. --

Col. 2, line 32: "$2\bar{h}yB_1$" should read --$2\hbar y\beta_1$--

Col. 2, line 47: "$2\bar{h}\omega_1$" should read --$2\hbar\omega_1$--

Col. 2, line 60: "$\bar{H}_{rf} = \hbar\omega_1[I_x(l\cos\omega - m\sin\omega) + I_y(l\sin\omega + m\cos\omega)]$" should read --$\tilde{H}_{rf} = \hbar\omega_1[I_x(l\cos\varphi - m\sin\varphi) + I_y(l\sin\varphi + m\cos\varphi)]$--

UNITED STATES PATENT AND TRADEMARK OFFICE
CERTIFICATE OF CORRECTION

PATENT NO. : 5,719,499

DATED : FEBRUARY 17, 1998

INVENTOR(S): CHANDRAKUMAR

It is certified that error appears in the above-identified patent and that said Letters Patent is hereby corrected as shown below:

Col. 2, line 62: "For $\omega=0$" should read --For $\varphi=0$ --

Col. 3, line 64: "$2\bar{h}$" should read -- $2\hbar$ --

Col. 4, line 2: "h" should read -- $\hbar$ --

Col. 4, line 3: "h" should read -- $\hbar$ --

Col. 4, line 3: "$I_{Iy}$" should read -- $I_y$ --

Col. 4, line 8: "$\bar{h}$" should read -- $\hbar$ --

Col. 5, line 9: "$2\bar{h}y$" should read -- $2\hbar y$ --

Col. 5, line 11: "$2\bar{h}\omega_t$" should read -- $2\hbar\omega_1$ --

UNITED STATES PATENT AND TRADEMARK OFFICE
CERTIFICATE OF CORRECTION

PATENT NO. : 5,719,499

DATED : FEBRUARY 17, 1998

INVENTOR(S) : CHANDRAKUMAR

It is certified that error appears in the above-identified patent and that said Letters Patent is hereby corrected as shown below:

Col. 5, line 20: "$\hbar \omega_1$" should read -- $\hbar \omega_1$ --

Col. 5, line 27: "$\hbar \omega_1$" should read -- $\hbar \omega_1$ --

Signed and Sealed this

Sixteenth Day of February, 1999

Attest:

*Attesting Officer*

*Acting Commissioner of Patents and Trademarks*